United States Patent [19]
Li et al.

[11] Patent Number: 6,040,243
[45] Date of Patent: Mar. 21, 2000

[54] METHOD TO FORM COPPER DAMASCENE INTERCONNECTS USING A REVERSE BARRIER METAL SCHEME TO ELIMINATE COPPER DIFFUSION

[75] Inventors: Jianxun Li; Simon Chooi; Mei-Sheng Zhou, all of Singapore, Singapore

[73] Assignee: Chartered Semiconductor Manufacturing Ltd., Singapore, Singapore

[21] Appl. No.: 09/398,292

[22] Filed: Sep. 20, 1999

[51] Int. Cl.$^7$ ................................................ H01L 21/44
[52] U.S. Cl. ........................ 438/687; 438/624; 438/637; 438/639; 438/666; 438/672
[58] Field of Search .................................... 438/687, 622, 438/627, 629, 692, 624, 631, 633, 637, 639, 672, 666

[56] References Cited

U.S. PATENT DOCUMENTS

| | | | |
|---|---|---|---|
| 5,595,937 | 1/1997 | Mikagi | 437/192 |
| 5,686,354 | 11/1997 | Avanzino et al. | 437/190 |
| 5,714,418 | 2/1998 | Bai et al. | 438/627 |
| 5,739,579 | 4/1998 | Chiang et al. | 257/635 |
| 5,741,626 | 4/1998 | Jain et al. | 430/314 |
| 5,744,376 | 4/1998 | Chan et al. | 437/190 |
| 5,817,572 | 10/1998 | Chiang et al. | 438/624 |
| 5,821,168 | 10/1998 | Jain | 438/692 |
| 5,824,599 | 10/1998 | Schacham-Diamand et al. | 438/678 |
| 5,863,707 | 1/1999 | Lin | 430/313 |
| 5,880,018 | 3/1999 | Boeck et al. | 438/619 |
| 5,891,513 | 4/1999 | Dubin et al. | 427/98 |
| 5,900,672 | 5/1999 | Chan et al. | 257/751 |
| 5,904,565 | 5/1999 | Nguyen et al. | 438/687 |
| 5,916,011 | 6/1999 | Kim et al. | 451/41 |
| 5,939,788 | 8/1999 | McTeer | 257/751 |
| 5,968,333 | 10/1999 | Nogaimi et al. | 205/184 |
| 5,969,422 | 10/1999 | Ting et al. | 257/762 |

*Primary Examiner*—John F. Niebling
*Assistant Examiner*—Lynne A. Gurley
*Attorney, Agent, or Firm*—George O. Saile; Rosemary L.S. Pike

[57] ABSTRACT

A method of fabricating damascene vias has been achieved. Diffusion of copper into dielectric layers due to overetch of the passivation layer is eliminated by a barrier layer. The method can be used to form dual damascene interconnects. Copper traces through an isolation layer are provided overlying a semiconductor substrate. A passivation layer is deposited overlying the copper traces and the isolation layer. A dielectric layer is deposited. A cap layer is deposited. The cap layer and the dielectric layer are patterned to expose the top surface of the passivation layer and to form trenches for the damascene vias. A barrier layer is deposited overlying the passivation layer, the dielectric layer, and the cap layer. The barrier layer is etched though to expose the top surfaces of the cap layer and the passivation layer. The barrier layer isolates the sidewalls of the trenches. The passivation layer is etched through to complete damascene vias. The barrier layer prevents copper sputtering onto the dielectric layer during the step of etching through the passivation layer.

20 Claims, 5 Drawing Sheets

METHOD TO FORM COPPER DAMASCENE INTERCONNECTS USING A REVERSE BARRIER METAL SCHEME TO ELIMINATE COPPER DIFFUSION

BACKGROUND OF THE INVENTION (1) Field of the Invention

The invention relates to a method of fabricating silicon structures, and more particularly, to the prevention of copper diffusion into dielectric layers during the formation of damascene copper interconnects in the manufacture of integrated circuit devices.

(2) Description of the Prior Art

Copper damascene interconnects are becoming increasingly common in the art of integrated circuit manufacture. Copper interconnects offer a significant advantage over traditional aluminum interconnects because of the lower resistivity of copper. Unfortunately, copper does not etch as easily as aluminum. This fact makes it difficult to fabricate copper interconnects using the traditional deposition and patterning techniques.

Damascene techniques allow copper to be used as the interconnect material. In damascene processes, trenches are first patterned into a dielectric material. Then copper is deposited overlying the dielectric material to fill the trenches. Finally, a polish down operation is performed to remove excess copper and to form the interconnect patterns within the confines of the trenches.

Referring to FIG. 1, a cross-section of a partially completed dual damascene structure in a prior art integrated circuit device is shown. A first dielectric layer 12 overlies a semiconductor substrate 10. A first copper interconnect 18, isolated by a first barrier layer 14, is formed through the first dielectric layer 12. A passivation layer 22 is formed overlying the first dielectric layer 12 and the first copper interconnects 18. A second dielectric layer 26 overlies the passivation layer 22. An etch stopping layer 30 overlies the second dielectric layer 26. A third dielectric layer 34 overlies the etch stopping layer 30. Finally, a cap layer 38 is formed overlying the third dielectric layer 34.

A trench and via trench have been etched in the dielectric layers overlying the first copper interconnects 18. The trench and via extend through both the third dielectric layer 34 and the second dielectric layer 26. In this configuration, the structure is described as dual damascene because, when a copper layer is subsequently deposited and polished down, both the via and the interconnects will be formed at the same time. Note that the passivation layer 22 that overlies the copper interconnect 18 has not been etched at this step in the process.

Referring now to FIG. 2, the passivation layer 22 is etched through to expose the underlying copper interconnect 18. At this point one significant problem in the prior art is demonstrated. To completely etch the passivation layer 22, some over etching must occur. During the over etching, copper material, in the form of elemental copper, copper oxides, and/or copper fluorides, in the copper interconnect 18 is also etched. The copper material that is displaced may then be sputter deposited 42 onto nearby surfaces. Some of the displaced copper is sputter deposited onto the surfaces of the second dielectric layer 26, the third dielectric layer 34, the etch stopping layer 30, and possibly the cap layer 38 as shown by 44.

The sputtered copper 44 would then diffuse into the second dielectric layer 26, the third dielectric layer 34, and, possibly, into the etch stopping layer 30 and the passivation layer 22. A wet or dry cleaning method is typically used to remove the sputtered copper but may still leave some sputtered copper if the cleaning chemistry employed is ineffective.

Referring now to FIG. 3, a barrier layer 46 is deposited overlying the cap layer 38 and filling the trench. The barrier layer 46 is typically composed of a refractory metal or refractory metal nitride. The purpose of the barrier layer 46 is to stop copper out-diffusion from the interconnect trench into the surrounding dielectric material. Unfortunately, if the cleaning method is ineffective, the sputter deposited copper 44 underlies the barrier layer 46. Therefore, further copper out-diffusion into the dielectric material occurs. Finally, a copper layer 50 is deposited overlying the barrier layer 46. The copper layer 50 completely fills the trenches.

Referring now to FIG. 4, the copper layer 50 and barrier layer 46 are polished down to expose the top surface of the cap layer 38. This polish down step removes the excess copper layer 50 to define the second copper interconnect and the via. A second problem is seen herein as significant dishing 54 occurs in the copper layer 50 overlying the trench. The cause of this dishing is the relatively higher polishing rate of the copper layer 50 compared to the barrier layer 46. Removal of all of the barrier layer 46 causes an over polish of the copper layer 50 and the undesirable dishing 54 results.

Several prior art approaches disclose methods to form dual damascene structures in the fabrication of integrated circuits. U.S. Pat. No. 5,821,168 to Jain discloses a process to form dual damascene structures. First, the trench and via are etched through the dielectric layers to the expose the top surface of the underlying copper trace. Second, a barrier layer is formed over the dielectric by nitriding. Third, a silicon adhesion layer is formed overlying the nitrided layer. Finally, copper is deposited and polished down to complete the dual damascene structure. U.S. Pat. No. 5,741,626 to Jain et al teaches a process to use tantalum nitride as an anti-reflective coating in the fabrication of dual damascene structures. U.S. Pat. No. 5,578,523 to Fiordalice et al discloses a process to form dual damascene structures where a polish assist layer is used to prevent dishing during the chemical mechanical polish of the metal layer. U.S. Pat. No. 5,871,572 to Chiang et al teaches a process to form dual damascene structures. U.S. Pat. No. 5,882,996 to Dai discloses a process to etch dual damascene trenches where a stack of photoresist, anti-reflective coating, and photoresist is used to pattern the trenches.

SUMMARY OF THE INVENTION

A principal object of the present invention is to provide an effective and very manufacturable method of forming single or dual damascene copper interconnects in the manufacture of integrated circuits.

A further object of the present invention is to provide a method to fabricate damascene copper interconnects where a barrier layer overlying a dielectric layer prevents the copper contamination of the dielectric layer during the via etch.

A yet further object of the present invention is to provide a method to fabricate damascene copper interconnects where excess barrier layer is removed prior to the deposition of the copper via fill layer to prevent dishing of the copper layer during the polish down step.

In accordance with the objects of this invention, a new method of fabricating dual damascene interconnects has been achieved. Copper traces through an isolation layer are provided overlying a semiconductor substrate. A passivation layer is deposited overlying the copper traces and the isolation layer. A first dielectric layer is deposited overlying the passivation layer. An etch stopping layer is deposited overlying the first dielectric layer. A second dielectric layer is deposited overlying the etch stopping layer. A cap layer is deposited overlying the second dielectric layer. The cap layer, the second dielectric layer, the etch stopping layer, and the first dielectric layer are patterned to form interconnect trenches and via trenches for the dual damascene interconnects overlying the copper traces. A barrier layer is deposited overlying the passivation layer, the first dielectric layer, the etch stopping layer, the second dielectric layer, and the cap layer. Depending on the thickness of the layers and the etching selectivity, the barrier layer may be etched through to expose the top surfaces of the passivation layer and the cap layer. The remaining barrier layer isolates the sidewalls of the interconnect trenches and via trenches. The passivation layer is etched through to expose the top surface of the copper traces. The barrier layer prevents copper sputtering onto the first dielectric layer and the second dielectric layer. A copper layer is deposited overlying the cap layer and completely filling the inteconnect and via trenches. The copper layer is polished down to the top surface of the cap layer to complete the dual damascene interconnects, and the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

This embodiment discloses the application of the present invention to the formation of dual damascene interconnects. The present invention can easily be applied to the formation of single damascene interconnects as well. It should be clear to those experienced in the art that the present invention can be applied and extended without deviating from the scope of the present invention.

Figure 1:
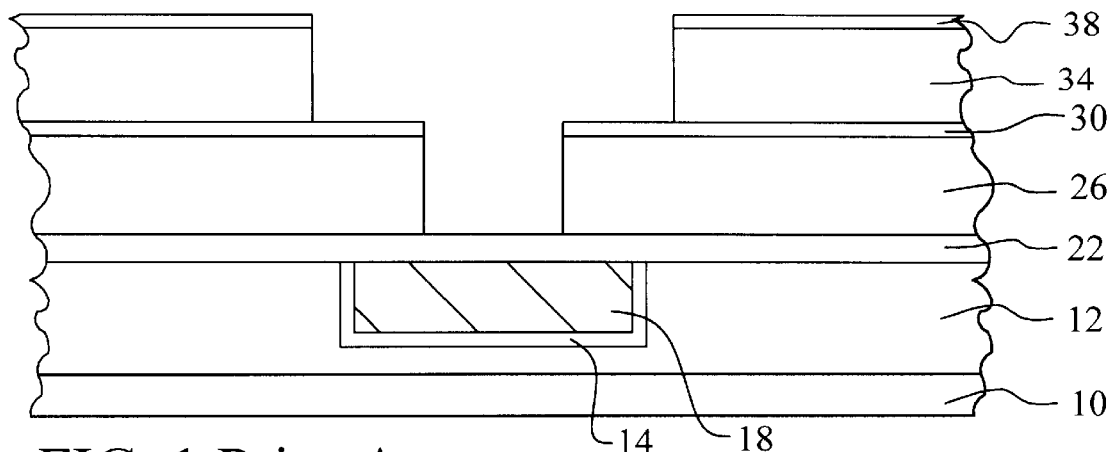
FIGS. 1 through 4 schematically illustrate in cross-section a partially completed prior art dual damascene interconnect in an integrated circuit device.
Figure 2:
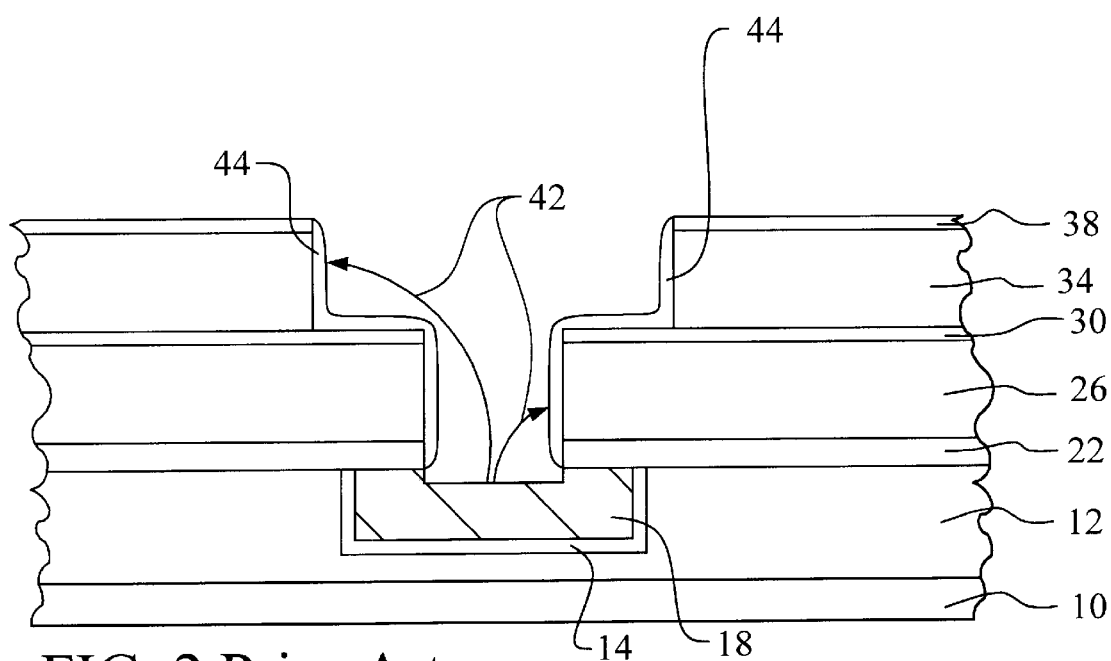
Figure 3:
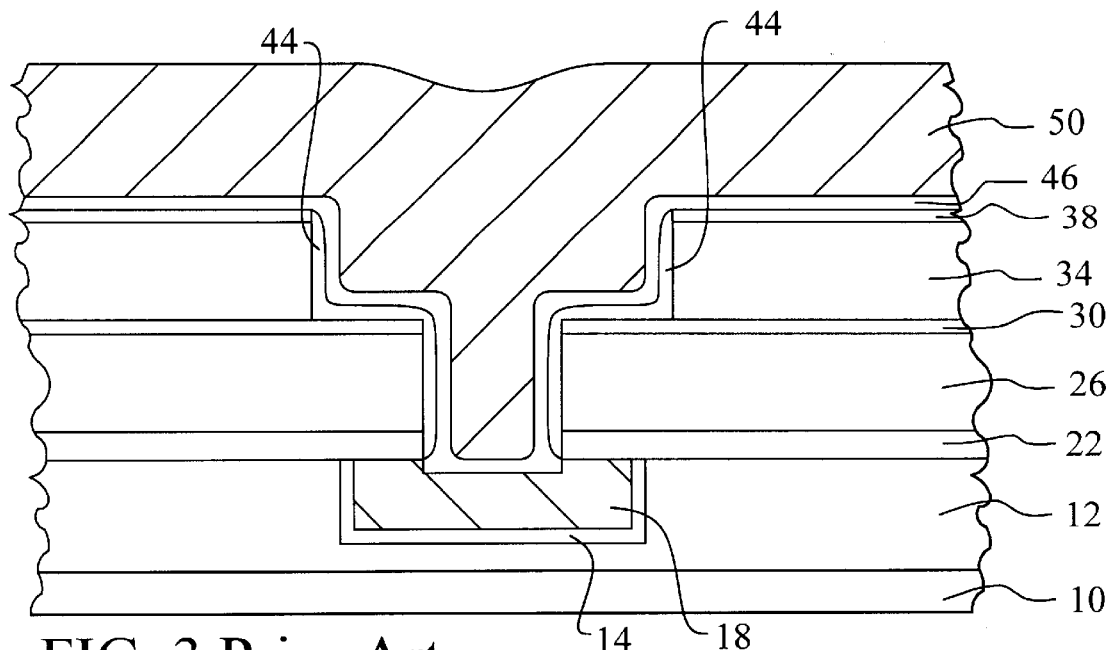
Figure 4:
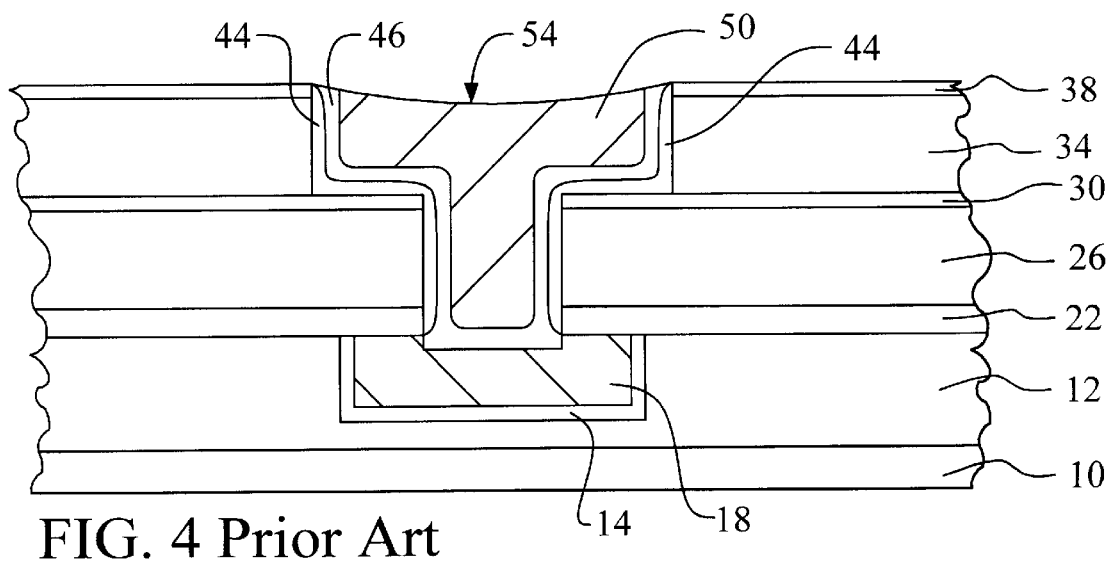
Figure 5:
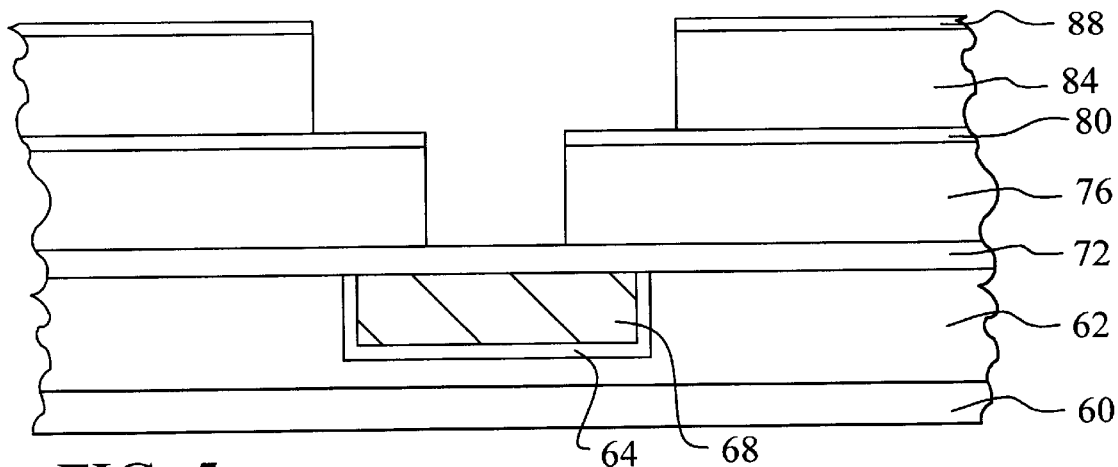
FIGS. 5 through 10 schematically illustrate in cross-sectional representation a preferred embodiment of the present invention.

Referring now more particularly to FIG. 5, there is illustrated a cross section of a partially completed integrated circuit device. In the preferred embodiment, the present invention is applied to a dual damascene interconnect trench and via trench as shown. A semiconductor substrate 60 is preferably composed of monocrystalline silicon. Copper traces 68 are conventionally provided through an isolation layer 62 overlying the semiconductor substrate 60. Typically in the art, a barrier metal layer 64 is formed between the copper traces 68 and the isolation layer 62. The top surfaces of the copper traces 68 and the isolation layer 62 are coplanar and exposed. Although not specifically illustrated within the cross section of FIG. 5, the isolation layer 62 may comprise several additional microelectronic layers as are commonly employed within the microelectronics fabrication. The topmost metal in these microelectronic layers would be the copper traces 68.

A passivation layer 72 is deposited overlying the copper traces 68 and the isolation layer 62. The passivation layer 72 serves as an etching stop in the via trench etch. The passivation layer 72 preferably comprises silicon nitride deposited to a thickness of between about 200 Angstroms and 5,000 Angstroms.

A first dielectric layer 76 is deposited overlying the passivation layer 72 to a thickness of between about 1,000 Angstroms and 10,000 Angstroms. The first dielectric layer 76 is preferably comprised of silicon dioxide, fluorinated silicon dioxide, hydrogen-doped silicon dioxide, carbon and hydrogen-doped silicon dioxide, or an organic polymer (fluorinated or non-fluorinated).

An etch stopping layer 80 is deposited overlying the first dielectric layer 76 to a thickness of between about 200 Angstroms and 5,000 Angstroms. The etch stopping layer 80 acts as an etching stop during the interconnect trench etch, if a separate interconnect trench etch is performed. If used, the etch stopping layer 80 is typically comprised of silicon nitride.

A second dielectric layer 84 is deposited overlying the etch stopping layer 80 to a thickness of between about 1,000 Angstroms and 10,000 Angstroms. The second dielectric layer 76 is preferably comprised of silicon dioxide, fluorinated silicon dioxide, or a low dielectric constant material such as methyl silsesquioxane or amorphous fluorocarbon polyimide.

A cap layer 88 is deposited overlying the second dielectric layer 84. The cap layer 88 is typically comprised of silicon nitride deposited conventionally to a thickness of between about 100 Angstroms and 5,000 Angstroms.

The trenches for the dual damascene interconnects and vias may be formed using any of several techniques. The lower via trench may be patterned and etched through first, followed by the upper interconnect trench. Likewise, the upper interconnect trench may be patterned and etched before the lower via trench. In addition, a self-aligned trench scheme may be used wherein both the upper and lower trenches are etched at the same time. For a self-aligned scheme, for example, the cap layer 88 and etch stopping layer 80 could be used as hard masks. All of these methods are known in the art. In the preferred embodiment, the cap layer 88, second dielectric layer 84, etch stopping layer 80, and first dielectric layer 76 are patterned to form the interconnect trenches and via trenches for the dual damascene interconnects.

Figure 6:
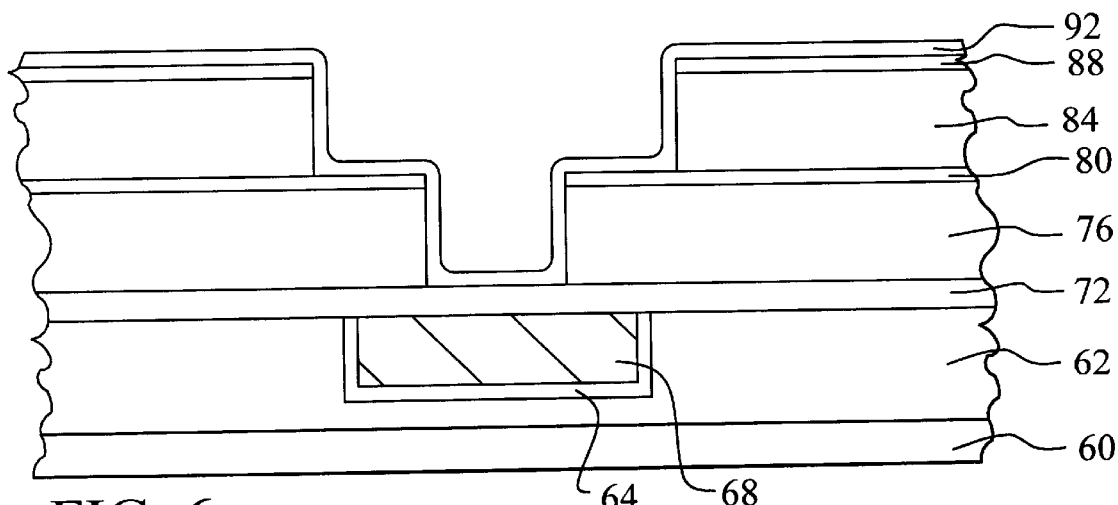

Referring now to FIG. 6, an important feature of the present invention is shown. A barrier layer 92 is deposited overlying the passivation layer 72, the first dielectric layer 76, the etch stop layer 80, the second dielectric layer 84, and the cap layer 88. The purpose of the barrier layer 92 is to serve as a barrier between the first dielectric layer 76 and the second dielectric layer 84 and the copper material that will serve as the dual damascene interconnect and via. The barrier layer 92 will prevent copper from out-diffusing into the dielectric material. The thickness of the barrier layer 92 is between about 50 Angstroms and 2,000 Angstroms.

The barrier layer 92 may be comprised of any of the group of: metals, such as tantalum and titanium; metal nitrides, such as tungsten nitride, titanium nitride, and tantalum nitride; metal silicon nitrides, such as tantalum silicon nitride; metal boron nitrides, such as tungsten boron nitride (WBN); and metal oxides, such as aluminum oxide. Combinations of metals, metal nitrides, metal silicon nitrides, metal boron nitrides, and metal oxides can also be used for the barrier layer 92. In addition, if tungsten nitride is selected as the barrier layer 92, it is not necessary to deposit a copper seed layer prior to electroless plating of copper. Tungsten nitride will act as a catalyst for the deposition of copper during the plating process.

Figure 7:
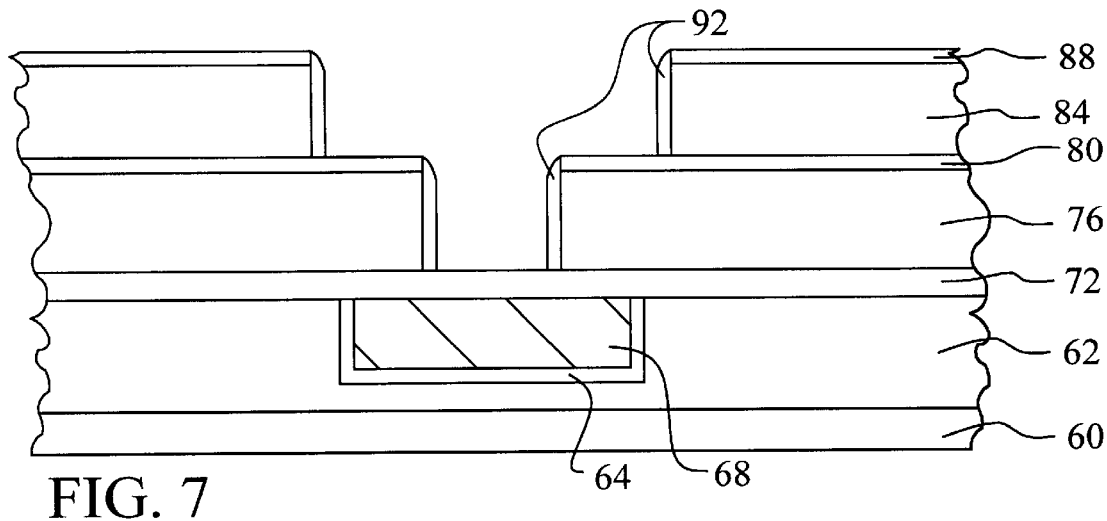

Referring now to FIG. 7, another important feature of the present invention is shown. The barrier layer 92 is etched though to expose the top surfaces of the passivation layer 72 and the cap layer 88. The barrier layer 92 may be left on the top surfaces of the passivation layer 72 and/or cap layer 88, depending on the initial barrier layer 92 thickness and the etching selectivity of the barrier layer 92 compared to that of the underlying layers. An anisotropic reactive ion etch leaves the barrier layer 92 only on the vertical sidewalls of the trenches. This etch has a chemistry comprising: one of the group of chlorine ($Cl_2$), boron trichloride ($BCl_3$), $CF_4$, $SF_6$, and combinations of these gases. Preferably, a combination of two or more of these gases would be used. By leaving the barrier layer 92 over the sidewalls of the trench, the first dielectric layer 76 and second dielectric layer 84 are protected from the sputtering of copper from the copper traces 68 during the subsequent etch of the passivation layer 72.

Figure 8:
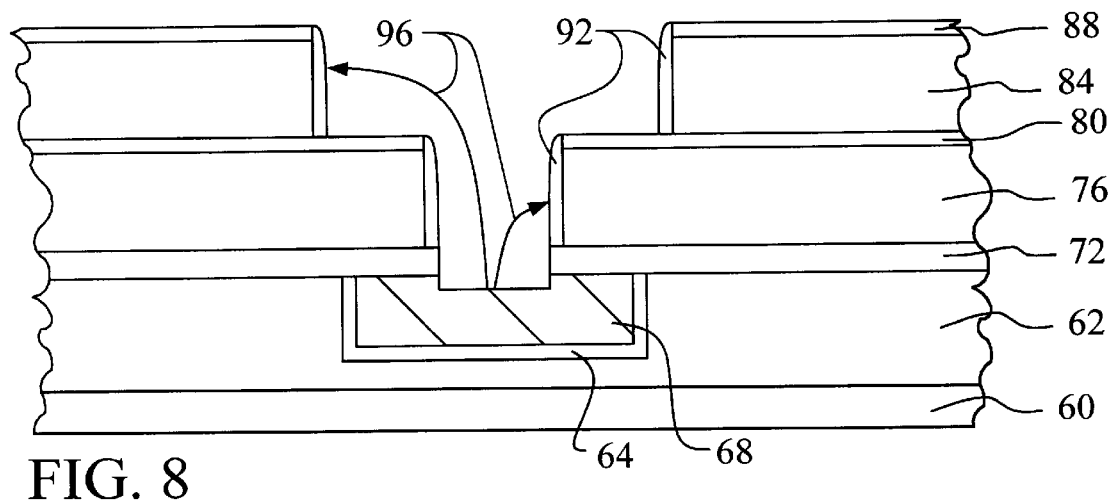

Referring now to FIG. 8, the passivation layer 72 is etched through to expose the top surfaces of the copper traces 68. This completes the via trenches of the dual damascene structure. The passivation layer 72 etch is performed using a conventional reactive ion etch. To insure that all of the passivation layer 72 has been removed, some over etching into the underlying copper material occurs. Therefore, some of the copper is sputter deposited 96 to other parts of the structure. Fortunately, the barrier layer 92 protects the dielectric layers from copper diffusion. After the etch, any free copper or etch products are then removed by a solvent stripper that does not have a significant strip rate on the barrier layer 92.

Figure 9:
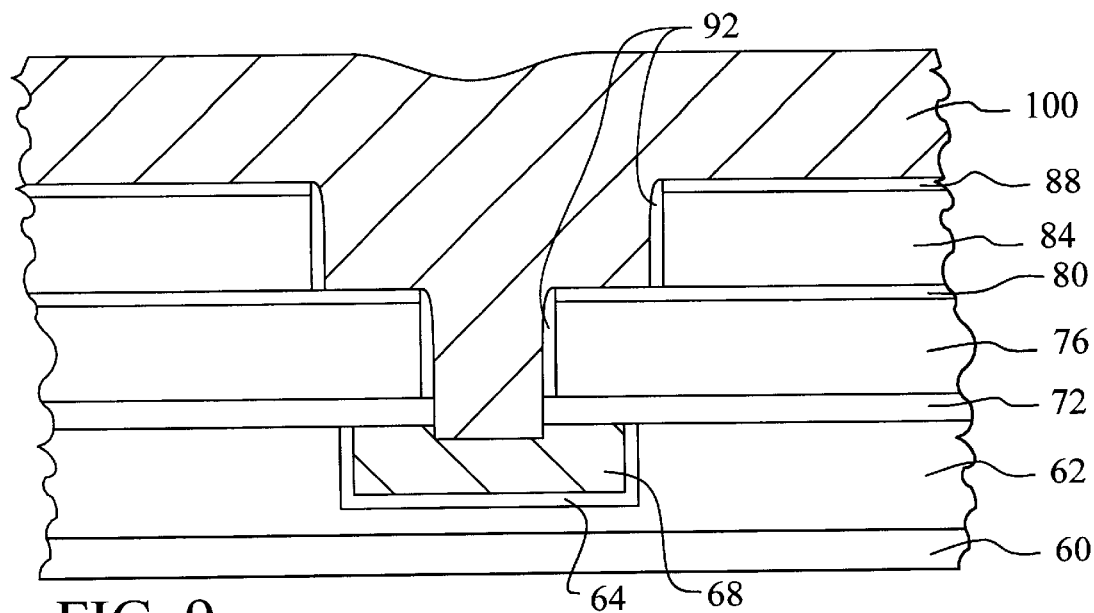

Referring now to FIG. 9, a copper layer 100 is deposited overlying the cap layer 88 and completely filling the trench. In the preferred embodiment, the copper layer 100 is deposited by electrochemical plating. A copper seed layer is first deposited using physical vapor deposition (PVD) or chemical vapor deposition (CVD). Then, the copper layer 100 is then deposited by electrochemical plating.

If tungsten nitride is used for the barrier layer 92, then no copper seed layer is necessary. A seedless electrochemical plating of copper is then used to deposit the copper layer 100. The tungsten nitride will serve as the catalyst for this plating reaction.

Figure 10:
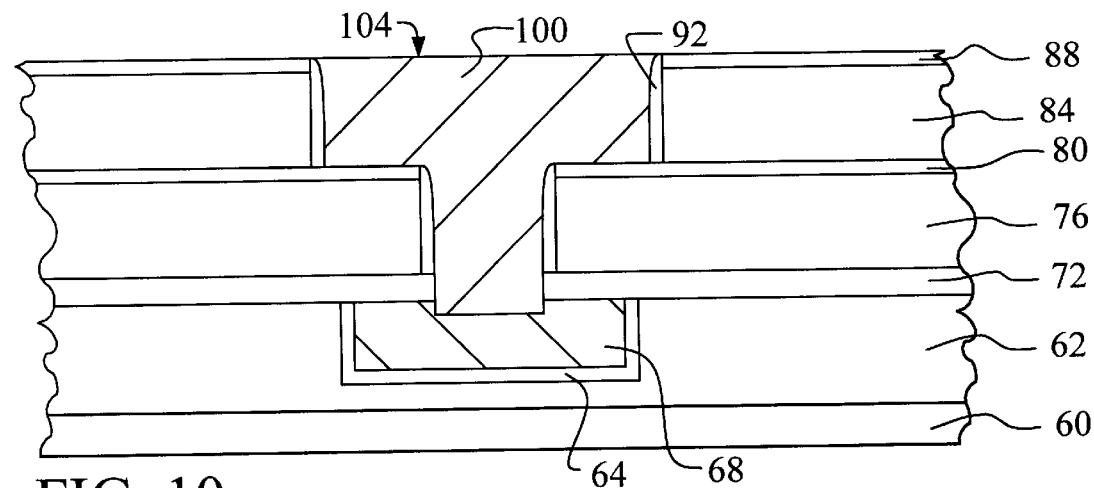

Referring now to FIG. 10, the copper layer 100 is polished down to the top surface of the cap layer 88 to complete the dual damascene interconnects. The copper layer 100 is polished down using conventional chemical mechanical polishing (CMP). The key feature of removing the barrier layer 92 from the top surface of the cap layer 88 eliminates dishing of the copper layer 100. As discussed in the prior art analysis, the dishing problem is caused by the higher etching rate of the copper layer 100 compared to the etching rate of the barrier layer 88. In the present invention, the barrier layer 88 is already confined to the trench. Therefore, since no polish down of the barrier layer 88 is required, the CMP step can be stopped before significant dishing occurs. A relatively flat surface 104 on the copper layer 100 is therefore created by the CMP step. The integrated circuit can then be completed by conventional means.

As shown in the preferred embodiment, the present invention provides a very manufacturable process for fabricating damascene or dual damascene structures in the manufacture of integrated circuit devices. Copper contamination of the dielectric layers and copper dishing are eliminated by the technique disclosed in the present invention.

While the invention has been particularly shown and described with reference to the preferred embodiments thereof, it will be understood by those skilled in the art that various changes in form and details may be made without departing from the spirit and scope of the invention.

What is claimed is:

1. A method to prevent copper diffusion into dielectric layers in the fabrication of a damascene via in the manufacture of an integrated circuit device comprising:

providing copper traces through an isolation layer overlying a semiconductor substrate;

depositing a passivation layer overlying said copper traces and said isolation layer;

depositing a dielectric layer overlying said passivation layer;

depositing a cap layer overlying said dielectric layer;

patterning said cap layer and said dielectric layer to form an opening for planned said damascene via and to expose the top surface of said passivation layer overlying said copper traces;

depositing a barrier layer overlying said passivation layer and said dielectric layer;

etching through said barrier layer to expose the top surfaces of said passivation layer and said cap layer wherein remaining said barrier layer isolates sidewalls of said opening; and etching through said passivation layer to the top surface of said copper traces to complete said damascene via in the manufacture of said integrated circuit device.

2. The method according to claim 1 wherein said passivation layer comprises silicon nitride.

3. The method according to claim 1 wherein said dielectric layer comprises one of the group of: silicon dioxide, fluorinated silicon dioxide, hydrogen-doped silicon dioxide, carbon and hydrogen-doped silicon dioxide, fluorinated organic polymer, and non-fluorinated organic polymer.

4. The method according to claim 1 wherein said cap layer comprises silicon nitride.

5. The method according to claim 1 wherein said barrier layer comprises one of the group of: metals, metal nitrides, metal silicon nitrides, metal boron nitrides, and metal oxides.

6. The method according to claim 1 wherein said step of etching through said barrier layer to expose the top surfaces of said passivation layer and said cap layer is by anisotropic reactive ion etching having a chemistry comprising: chlorine ($Cl_2$), boron trichloride ($BCl_3$), carbon tetrafluoride ($CF_4$), sulfur hexafluoride ($SF_6$), and combinations of these gases.

7. The method according to claim 1 wherein said barrier layer is deposited to a thickness of between about 50 Angstroms and 2,000 Angstroms.

8. The method according to claim 1 wherein said barrier layer prevents copper sputtering onto said dielectric layer during said step of etching through said passivation layer.

9. A method to prevent copper diffusion into dielectric layers in the fabrication of dual damascene interconnects in the manufacture of an integrated circuit device comprising:

providing copper traces through an isolation layer overlying a semiconductor substrate;

depositing a passivation layer overlying said copper traces and said isolation layer;

depositing a dielectric layer overlying said passivation layer;

depositing a cap layer overlying said dielectric layer;

patterning said cap layer and said dielectric layer to expose the top surface of said passivation layer and to form interconnect trenches and via trenches for dual damascene interconnects overlying said copper traces;

depositing a barrier layer overlying said passivation layer, said dielectric layer, and said cap layer;

etching though said barrier layer to expose the top surfaces of said passivation layer and said cap layer wherein remaining said barrier layer isolates sidewalls of said interconnect trenches and via trenches;

etching through said passivation layer to expose the top surface of said copper traces;

depositing a copper layer overlying said cap layer, said barrier layer, and said copper traces, and completely filling said interconnect trenches and said via trenches; and polishing down said copper layer to the top surface of said cap layer thereby completing said dual damascene interconnects in the manufacture of said integrated circuit device.

10. The method according to claim 9 wherein said passivation layer comprises silicon nitride.

11. The method according to claim 9 wherein said dielectric layer comprises one of the group of: silicon dioxide, fluorinated silicon dioxide, hydrogen-doped silicon dioxide, carbon and hydrogen-doped silicon dioxide, fluorinated organic polymer, and non-fluorinated organic polymer.

12. The method according to claim 9 wherein said cap layer comprises silicon nitride.

13. The method according to claim 9 wherein said barrier layer comprises one of the group of: metals, metal nitrides, metal silicon nitrides, metal boron nitrides, and metal oxides.

14. The method according to claim 9 wherein said barrier layer prevents copper sputtering onto said dielectric layer during said step of etching through said passivation layer.

15. The method according to claim 9 wherein said barrier layer comprises tungsten nitride and wherein said step of depositing said copper layer is by seedless electrochemical plating.

16. A method to prevent copper diffusion into dielectric layers in the fabrication of dual damascene interconnects in the manufacture of an integrated circuit device comprising:

providing copper traces through an isolation layer overlying a semiconductor substrate;

depositing a passivation layer of silicon nitride overlying said copper traces and said isolation layer;

depositing a first dielectric layer overlying said passivation layer;

depositing an etch stopping layer overlying said first dielectric layer;

depositing a second dielectric layer overlying said etch stopping layer;

depositing a cap layer overlying said second dielectric layer;

patterning said cap layer, said second dielectric layer, said etch stopping layer, and said first dielectric layer to expose the top surface of said passivation layer and to form interconnect trenches and via trenches for dual damascene interconnects overlying said conductive traces;

depositing a barrier layer of tungsten nitride overlying said passivation layer, said second dielectric layer, said etch stopping layer said cap layer, and said first dielectric layer;

etching though said barrier layer to expose the top surfaces of said passivation layer and said cap layer wherein remaining said barrier layer isolates sidewalls of said interconnect trenches and via trenches;

etching through said passivation layer to expose the top surface of said copper traces wherein said barrier layer prevents copper sputtering onto said first dielectric layer and said second dielectric layer;

depositing a copper layer by seedless electrochemical plating overlying said cap layer, said barrier layer, and said copper traces, and completely filling said via trenches and said interconnect trenches; and polishing down said copper layer to the top surface of said cap layer thereby completing said dual damascene interconnects in the manufacture of said integrated circuit device.

17. The method according to claim 16 wherein said first dielectric layer comprise one of the group of: silicon dioxide, phosphosilicate glass and polyimide.

18. The method according to claim 16 wherein said etch topping layer comprises silicon nitride.

19. The method according to claim 16 wherein said second dielectric layer comprise one of the group of: silicon dioxide, fluorinated silicon dioxide, hydrogen-doped silicon dioxide, carbon and hydrogen-doped silicon dioxide, fluorinated organic polymer, and non-fluorinated organic polymer.

20. The method according to claim 16 wherein said cap layer comprises silicon nitride.

* * * * *